United States Patent
Waldrop

(10) Patent No.: US 9,479,361 B2
(45) Date of Patent: Oct. 25, 2016

(54) METHOD AND APPARATUS FOR SELECTING AN OPERATING MODE BASED ON A DETERMINATION OF THE AVAILABILITY OF INTERNAL CLOCK SIGNALS

(75) Inventor: William C. Waldrop, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/071,287

(22) Filed: Mar. 24, 2011

(65) Prior Publication Data
US 2011/0169529 A1 Jul. 14, 2011

Related U.S. Application Data

(63) Continuation of application No. 12/486,381, filed on Jun. 17, 2009, now Pat. No. 7,915,924, which is a continuation of application No. 11/195,897, filed on Aug. 3, 2005, now Pat. No. 7,560,956.

(51) Int. Cl.
*H03K 19/00* (2006.01)
*H04L 25/02* (2006.01)
(Continued)

(52) U.S. Cl.
CPC ......... *H04L 25/0278* (2013.01); *G11C 7/1045* (2013.01); *G11C 7/1051* (2013.01);
(Continued)

(58) Field of Classification Search
CPC .. H03K 5/1252; H03K 5/135; G11C 11/406; G11C 7/222; G11C 11/4076; G11C 7/22; G11C 7/1072; G11C 11/40615; G11C 2207/2227; G11C 5/14; G11C 2211/4067; G11C 11/4074; G11C 7/1066; G11C 7/1045

USPC .............. 326/21, 93, 95–98, 26, 30, 81–83, 326/86–87; 365/154, 194, 233.1
See application file for complete search history.

(56) References Cited

U.S. PATENT DOCUMENTS 5,258,952 A   11/1993  Coker et al.
5,471,157 A   11/1995  McClure
(Continued)

OTHER PUBLICATIONS

"1.8 Volt Intel Wiresless Flash Memory (W18)", *Datasheet, Intel Corporation*, Jan. 2003, pp. 1-102.
(Continued)

*Primary Examiner* — Anh Tran
(74) *Attorney, Agent, or Firm* — Dorsey & Whitney LLP

(57) ABSTRACT

A system and method to operate an electronic device, such as a memory chip, with an output driver circuit that is configured to include an ODT (On-Die Termination) mode detector detects whether there is sufficient internal clocking available to operate the ODT portion in the output driver in the synchronous mode of operation or to switch the operation to the asynchronous mode. The clock-sufficiency based determination of internal ODT mode of operation (synchronous vs. asynchronous) avoids utilization of complex and inflexible clock processing logic in an ODT control unit in the output driver. This enables the actual clocking to the ODT circuitry to be changed during various device operational modes (e.g., active, power down, etc.) without re-designing the ODT control logic for each of those modes. The simplicity and flexibility of the ODT mode detector design allows for efficient use of chip real estate without affecting the signal transfer speed of the output driver in the electronic device. Because of the rules governing abstracts, this abstract should not be used to construe the claims.

15 Claims, 4 Drawing Sheets

(51) Int. Cl.
*G11C 7/10* (2006.01)
*G11C 7/22* (2006.01)
*G11C 11/4076* (2006.01)
*G11C 11/4096* (2006.01)

(52) U.S. Cl.
CPC .......... *G11C7/1066* (2013.01); *G11C 7/1069* (2013.01); *G11C 7/1072* (2013.01); *G11C 7/22* (2013.01); *G11C 7/222* (2013.01); *G11C 11/4076* (2013.01); *G11C 11/4096* (2013.01)

(56) References Cited

U.S. PATENT DOCUMENTS

| | | | |
|---|---|---|---|
| 5,566,129 A | 10/1996 | Nakashima et al. | |
| 5,600,605 A | 2/1997 | Schaefer | |
| 5,666,321 A | 9/1997 | Schaefer | |
| 5,805,517 A | 9/1998 | Pon | |
| 5,835,440 A | 11/1998 | Manning | |
| 6,058,070 A | 5/2000 | La Rosa | |
| 6,075,751 A | 6/2000 | Tedrow | |
| 6,163,172 A | 12/2000 | Bazuin et al. | |
| 6,166,990 A | 12/2000 | Ooishi et al. | |
| 6,222,388 B1 * | 4/2001 | Bridgewater, Jr. | H03K 19/0016 326/57 |
| 6,249,142 B1 | 6/2001 | Hall et al. | |
| 6,271,704 B1 | 8/2001 | Babcock et al. | |
| 6,373,303 B2 | 4/2002 | Akita | |
| 6,396,758 B2 | 5/2002 | Ikeda et al. | |
| 6,564,285 B1 | 5/2003 | Mills et al. | |
| 6,597,615 B2 | 7/2003 | Mizugaki | |
| 6,658,544 B2 | 12/2003 | Gray | |
| 6,675,256 B1 | 1/2004 | Harrand | |
| 6,690,606 B2 | 2/2004 | Lovett et al. | |
| 6,701,419 B2 | 3/2004 | Tomaiuolo et al. | |
| 6,714,479 B2 | 3/2004 | Takahashi et al. | |
| 6,754,132 B2 * | 6/2004 | Kyung ...................... 365/233.1 | |
| 6,754,746 B1 * | 6/2004 | Leung ................... G06F 13/40 365/203 |
| 6,791,898 B1 * | 9/2004 | Manapat .............. G11C 7/1021 365/230.01 |
| 6,806,728 B2 | 10/2004 | Nguyen et al. | |
| 6,847,225 B2 | 1/2005 | Viehmann et al. | |
| 6,920,524 B2 * | 7/2005 | Lovett ................ G06F 13/1689 365/194 |
| 6,924,660 B2 | 8/2005 | Nguyen et al. | |
| 6,958,613 B2 | 10/2005 | Braun et al. | |
| 6,973,009 B2 * | 12/2005 | Toda ..................... G11C 7/1045 365/191 |
| 6,980,020 B2 | 12/2005 | Best et al. | |
| 7,019,555 B2 | 3/2006 | Lee | |
| 7,020,818 B2 | 3/2006 | Dour et al. | |
| 7,034,565 B2 | 4/2006 | Lee | |
| 7,064,989 B2 | 6/2006 | Na et al. | |
| 7,091,744 B2 | 8/2006 | Song | |
| 7,092,299 B2 | 8/2006 | Kwak et al. | |
| 7,120,085 B2 * | 10/2006 | Lee ....................... G11C 7/1045 365/230.08 |
| 7,142,461 B2 * | 11/2006 | Janzen ................. G06F 13/4086 365/189.14 |
| 7,151,390 B2 | 12/2006 | Nguyen et al. | |
| 7,154,295 B2 | 12/2006 | Choe | |
| 7,170,313 B2 | 1/2007 | Shin | |
| 7,176,711 B2 | 2/2007 | Park et al. | |
| 7,180,327 B2 | 2/2007 | So | |
| 7,196,966 B2 * | 3/2007 | Jin ....................... G11C 7/1051 365/229 |
| 7,208,973 B2 | 4/2007 | Kwon | |
| 7,239,560 B2 | 7/2007 | Lee et al. | |
| 7,269,043 B2 | 9/2007 | Lee | |
| 7,312,627 B2 | 12/2007 | An | |
| 7,459,929 B2 | 12/2008 | Chung | |
| 7,560,956 B2 | 7/2009 | Waldrop | |
| 2003/0099138 A1 * | 5/2003 | Kyung ................. G11C 7/1072 365/200 |
| 2004/0032319 A1 | 2/2004 | Kyung | |
| 2004/0218434 A1 | 11/2004 | Hwang et al. | |
| 2005/0151562 A1 * | 7/2005 | Kurts ................. H04L 25/0278 326/30 |
| 2007/0030030 A1 | 2/2007 | Waldrop | |
| 2008/0159026 A1 * | 7/2008 | Oh et al. ........................ 365/194 |
| 2008/0164904 A1 * | 7/2008 | Kim ................................ 326/30 |
| 2009/0302892 A1 | 12/2009 | Waldrop | |

OTHER PUBLICATIONS

"Intel 1.8 Volt Wireless Flash Memory (W18/W30)", *Product Brief, Intel Corporation* 2002, pp. 1-2.

* cited by examiner

__METHOD AND APPARATUS FOR SELECTING AN OPERATING MODE BASED ON A DETERMINATION OF THE AVAILABILITY OF INTERNAL CLOCK SIGNALS__

CROSS REFERENCE TO RELATED APPLICATION(S)

This application is a continuation of U.S. patent application Ser. No. 12/486,381, filed Jun. 17, 2009, and issued as U.S. Pat. No. 7,915,924, on Mar. 29, 2011, which application is a continuation of U.S. patent application Ser. No. 11/195,897, filed Aug. 3, 2005, and issued as U.S. Pat. No. 7,560,956 on Jul. 14, 2009. These applications and patents are each incorporated herein by reference, in their entirety, for any purpose.

BACKGROUND

1. Field of the Disclosure

The present disclosure generally relates to electronic devices with various modes of operation and, in one embodiment, to a system and method for automatically selecting between a asynchronous mode or a synchronous mode of operation for an electronic device having an on die termination (ODT) circuit.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. A memory device may send the data to the data-requesting device in the system (e.g., a processor or a memory controller) via an output driver circuit to maintain requisite signal strength and data integrity.

FIG. 1 is a simplified diagram illustrating a portion of an output driver 10 in an electronic device (e.g., a memory chip) (not shown). The output driver 10 may perform a signal transfer function from an internal or signal-generating part of the electronic device to the external pins on the electronic device, which pins may allow the signal to be propagated to the appropriate device in the system via a signal transfer mechanism (e.g., a bus). In the case of a memory device (not shown), the output driver 10 may transfer the memory's internally-generated data (DQ) signals 18 to data (DQ) pins 20 of the memory chip. It is observed here that although the operation of the output driver 10 is discussed hereinbelow with reference to a memory chip, the discussion may equally apply to such output driver configurations in other non-data signal transfer applications in other electronic devices as well The output driver unit 10 is shown connected to the data (DQ) pins 20 of the memory chip (not shown). The driver 10 receives the data signals (DQ Out) 18 from the memory cells (not shown) to be output on the DQ pins 20 (e.g., during a memory read operation). In a DDR (Double Data Rate) DRAM (Dynamic Random Access Memory) memory chip, the output driver 10 may also include a set of ODT (On-Die Termination) legs or circuit portion 12 and a set of non-ODT legs or circuit portion 14. The on-chip ODT circuit portion 12 may be used to improve signal integrity in the system. An ODT pin (one of the pins on a memory chip (not shown)) may be provided on the chip to receive an externally-supplied (e.g., by a memory controller (not shown)) ODT enable/disable signal to activate/deactivate the ODT legs 12.

Although the ODT circuit 12 in FIG. 1 is shown associated with the DQ pins 20, in practice, corresponding ODT circuits 12 may be provided for any other pins on a memory chip including, for example, the address pins and the control pins (not shown in FIG. 1, but shown in FIG. 2). The ODT circuit 12 may be more prevalent in DDR SDRAMs (Synchronous Dynamic Random Access Memories).

In operation, the ODT circuit 12 provides desired termination impedance to improve signal integrity by controlling reflected noise on the transfer line connecting the memory chip to another processing device, e.g., a memory controller (not shown). In a DDR SDRAM, the termination register (not shown) that was conventionally mounted on a motherboard carrying memory chips is incorporated inside the DDR SDRAM chip to enable or disable the ODT circuit 12 when desired. The termination register may be programmed through an ODT pin (not shown) on the memory chip by an external processor (e.g., a memory controller) to enable/disable the ODT circuit 12. As is known in the art, for example, when two or more memory chips are present in a system, during a memory write operation to one of the chips, the ODT circuit 12 in the other chip (which is not receiving data) is activated to absorb any signal propagations or reflections received on the data lines (or address or control lines, as may be the case) of that "inactive" chip. This selective activation/deactivation of the ODT circuit 12 (e.g., in the memory chip that is not currently sending or receiving data) prevents the "inactive" chip from receiving spurious signals, thereby avoiding data corruption in the chip. The ODT circuit 12 thus improves integrity of signals (e.g., data signals in case of a memory chip) to be provided to external devices via the output driver 10. The non-ODT circuit portion 14 in the output driver 10 may provide routine signal driver functions to data signals as is known in the art.

The output driver 10 may also include an ODT enable/disable logic 16 to provide activation/deactivation of the tuning transistors in the ODT legs 12. A similar control unit (not shown) may also be provided for the activation/deactivation of the non-ODT legs 14. The ODT enable/disable unit 16 may generate a control signal (not shown) that is supplied to the ODT circuit portion 12 to activate or deactivate the ODT legs 12 based on the status of the control signal. The ODT legs 12 as well as the non-ODT legs 14 of the output driver 10 provide necessary signal amplification and buffering to the data signals to be sent from the memory cells (not shown) to the DQ pins 20. However, the ODT legs 12 may additionally provide the ODT functionality when activated. Thus, although the ODT and non-ODT legs may be identically constructed, in operation of the driver 10, the ODT legs 12 may provide output driver function as well as the ODT functionality, whereas the non-ODT legs 14 may just provide the data output driver function (data signal amplification and buffering). Each output of the driver 10 may have an IC (integrated circuit) output pad (not shown) to convey the data signals to the corresponding DQ pins 20 as is known in the art. It is noted here that only a portion of the output driver 10 is shown in FIG. 1 for ease of illustration and clarity. Additional circuit details of FIG. 1 are known in the art and not relevant here and, hence, are not discussed in detail here.

It is observed that in a DDR DRAM chip, even though the external ODT pin (not shown) on the memory chip may receive the ODT enable/disable signal (e.g., from a memory controller (not shown) as noted hereinbefore) in a synchronous manner, the internal operation of the ODT portion 12 can be made synchronous or asynchronous (using the ODT enable/disable logic unit 16) depending on the chip's current mode of operation. For example, when the chip is in a power down mode, the ODT enable/disable logic 16 may detect the power down state and operate the ODT portion 12 in an asynchronous mode even though the external ODT enable/disable signal requires synchronous operation. In the specification that governs the hand-off from when the part (e.g., a memory chip) changes ODT internal operational mode from asynchronous to synchronous and vice versa, the synchronous ODT mode timing is treated as a subset of the asynchronous ODT mode timing. Therefore, it is within the specification for the ODT portion 12 to be operating synchronously internally even when the memory chip is allowed to operate its ODT portion 12 in an asynchronous manner by an external controller (not shown).asynchronous to synchronous and vice versa, the synchronous ODT mode timing is treated as a subset of the asynchronous ODT mode timing. Therefore, it is within the specification for the ODT portion 12 to be operating synchronously internally even when the memory chip is allowed to operate its ODT portion 12 in an asynchronous manner by an external controller (not shown).

The prior art ODT enable/disable logic unit or ODT control unit 16 is a complex circuit involving significant delays in receiving and processing external clock and ODT enable/disable signal. The ODT control unit 16 merely detects (based on appropriate internally-generated clocking signals (not shown) input thereto) the current state of operation of the memory chip and, in response, determines the mode of operation (asynchronous or synchronous) for the ODT legs 12. For example, if various internal clocking signals (derived from the external clock and/or the external ODT enable/disable signal) indicate that the memory chip is entering the power down mode, then the ODT control unit 16 will decide to operate the ODT legs 12 in the asynchronous mode. If the ODT legs 12 are currently operating in the synchronous mode, then the power down indication may require the ODT control unit 16 to switch the ODT mode of operation to the asynchronous mode irrespective of whether the synchronous mode can be continued internally (this is possible, as mentioned before, because the synchronous mode timing specification is a subset of the asynchronous mode timing requirements). The reliance of the ODT control unit 16 on the device's next state (e.g., power down state) may result in wasted clock cycles that may still be available to continue the synchronous ODT mode of operation before the internal clocks are stopped for the power down mode. As is known in the art, there is a delay between a decision is made to enter the power down mode and the internal clocks are finally stopped for the power down mode. Because of the significant delays involved in processing of various clock signals input to the complex prior art ODT control unit 16, it may be easier for the prior art ODT control unit 16 to rely on the current memory state indicated by the clocking signals and switch the ODT mode of operation without regard to the actual status and availability of clock signals internally. Furthermore, the prior art ODT control unit 16 is heavily dependent on the memory device's internal clocking logic. Therefore, when there are design changes in the device clocking logic, all ODT control units 16 on the device (e.g., a memory chip) have to be re-designed/re-configured to accommodate the changes in the clocking logic, which can be time consuming and expensive.

It is therefore desirable to devise an output driver circuit configuration that employs a simple and significantly less complex detector circuit to automatically determine internal ODT mode of operation (asynchronous vs. synchronous) without affecting the speed with which signals may be output from the electronic device and without being affected by the design changes in the device clocking logic. It is further desirable to obtain such an output driver mechanism without significantly adding logic circuitry or requiring more space on the die.

SUMMARY

The present disclosure contemplates a method of operating an electronic device. The method comprises determining clock sufficiency for an ODT (on die termination) portion of an output driver in the electronic device; and operating the ODT portion in a synchronous mode or an asynchronous mode depending on the determination of clock sufficiency.

In one embodiment, the present disclosure further contemplates another method of operating an electronic device. The method comprises determining whether at least one clock pulse is present during a clock period for an ODT (on die termination) portion of an output driver in the electronic device; and operating the ODT portion in a synchronous mode or an asynchronous mode depending on whether the at least one clock pulse is present or absent, respectively, during the clock period.

In another embodiment, the present disclosure contemplates a method of operating an electronic device, wherein the method comprises determining clock sufficiency for a circuit portion in the electronic device; and operating the circuit portion in a synchronous mode or an asynchronous mode depending on the determination of clock sufficiency.

In a further embodiment, the present disclosure contemplates an electronic circuit. The electronic circuit comprises an output driver having an ODT (on die termination) portion; and an ODT control logic in the output driver configured to operate the ODT portion in a synchronous mode or an asynchronous mode. The ODT control logic includes an ODT mode detector configured to determine clock sufficiency for the ODT portion and to perform one of the following in response thereto: (1) assert a mode signal to allow the ODT control logic to operate the ODT portion in the asynchronous mode when the determination indicates clock insufficiency, or (2) de-assert the mode signal to allow the ODT control logic to operate the ODT portion in the synchronous mode when the determination indicates clock sufficiency.

In a different embodiment, the present disclosure contemplates a memory device having the circuit described above, and a computer system incorporating such memory device.

According to a system and method of the present disclosure an electronic device, such as a memory chip, may be operated with an output driver circuit that is configured to include an ODT (On-Die Termination) asynchronous/synchronous mode detector that detects whether there is sufficient internal clocking available to operate the ODT portion in the output driver in the synchronous mode of operation or to switch the operation to the asynchronous mode. The clock-sufficiency based determination of internal ODT mode of operation (synchronous vs. asynchronous) avoids utilization of complex and inflexible clock processing logic in an ODT control unit in the output driver. The switching of ODT mode of operation based on a rigid reliance on the indication of the current state of the electronic device (e.g., active state, power down state, etc.) is avoided to take into account the presence and sufficiency of clock signals required to sustain the new ODT mode of operation. This enables the actual clocking to the ODT circuitry to be changed during various device operational modes (e.g., active, power down, etc.)

without re-designing the ODT control logic for each of those modes. The simplicity and flexibility of the ODT mode detector design allows for efficient use of chip real estate without affecting the signal transfer speed of the output driver in the electronic device.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1"). Furthermore, in the positive logic notation, symbols "*" or "_" (e.g., Reset* or RST_) placed after a signal name indicates an active low signal, whereas a signal name without such markings (e.g., ODT, CLK, etc.) at the end indicates an active high signal.

Figure 2:
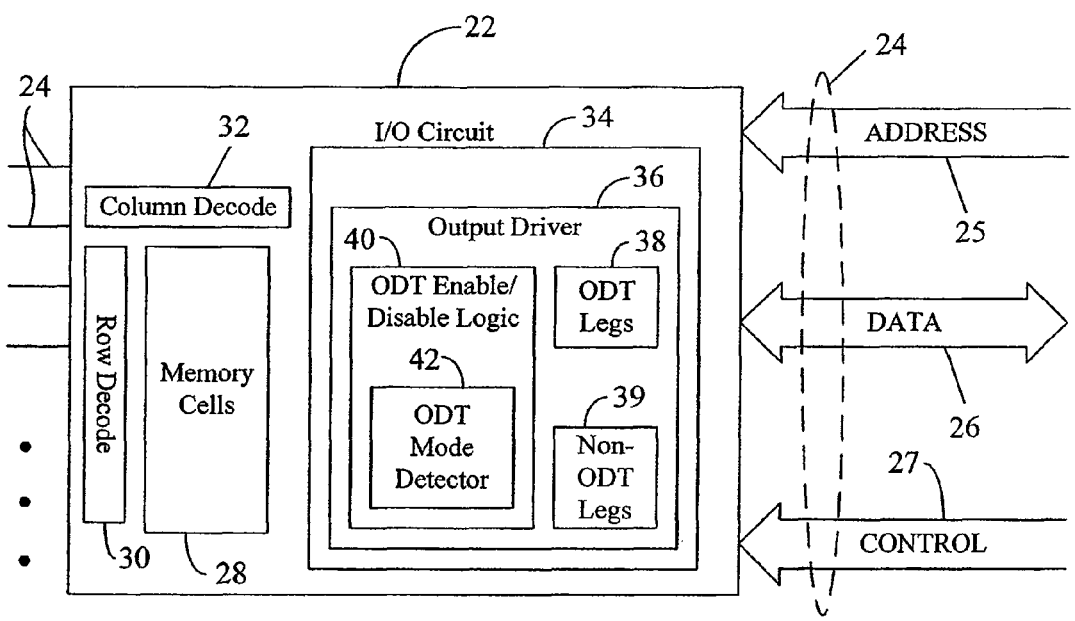
FIG. 2 is a simplified block diagram showing a memory chip or memory device that employs an output driver with an ODT mode detector according to one embodiment of the present disclosure.

FIG. 2 is a simplified block diagram showing a memory chip or memory device 22 that employs an output driver 36 with an ODT mode detector 42 according to one embodiment of the present disclosure. As shown in FIG. 2 and discussed later hereinbelow, an output driver 36 in the memory chip's 22 I/O circuit portion 34 may include the ODT mode detector 42 as part of an ODT enable/disable logic or ODT control logic 40. The detailed construction and operation of the ODT mode detector 42 according to one embodiment of the present disclosure is described hereinbelow with reference to FIGS. 3-7. The memory chip 22 may be part of a DIMM (dual in-line memory module) or a PCB (printed circuit board) containing many such memory chips (not shown in FIG. 2). The memory chip 22 may include a plurality of pins or balls 24 located outside of chip 22 for electrically connecting the chip 22 to other system devices. Some of those pins 24 may constitute memory address pins or address bus 25, data (DQ) pins or data bus 26, and control pins or control bus 27. It is evident that each of the reference numerals 25-27 designates more than one pin in the corresponding bus. Further, it is understood that the schematic in FIG. 2 is for illustration only. That is, the pin arrangement or configuration in a typical memory chip may not be in the form shown in FIG. 2.

A processor or memory controller (not shown) may communicate with the chip 22 and perform memory read/write operations. The processor and the memory chip 22 may communicate using address signals on the address lines or address bus 25, data signals on the data lines or data bus 26, and control signals (e.g., a row address select (RAS) signal, a column address select (CAS) signal, etc. (not shown)) on the control lines or control bus 27. The "width" (i.e., number of pins) of address, data and control buses may differ from one memory configuration to another.

Those of ordinary skill in the art will readily recognize that memory chip 22 of FIG. 2 is simplified to illustrate one embodiment of a memory chip and is not intended to be a detailed illustration of all of the features of a typical memory chip. Numerous peripheral devices or circuits may be typically provided along with the memory chip 22 for writing data to and reading data from the memory cells 28. However, these peripheral devices or circuits are not shown in FIG. 2 for the sake of clarity.

The memory chip 22 may include a plurality of memory cells 28 generally arranged in rows and columns to store data in rows and columns. A row decode circuit 30 and a column decode circuit 32 may select the rows and columns in the memory cells 28 in response to decoding an address provided on the address bus 25. Data to/from the memory cells 28 is then transferred over the data bus 26 via sense amplifiers and a data output path (not shown), but generally represented by an input/output (I/O) circuit 34. A memory controller (not shown) may provide relevant control signals (not shown) on the control bus 27 to control data communication to and from the memory chip 22 via the I/O circuit 34. The I/O circuit 34 may include a number of data output buffers or output drivers to receive the data bits from the memory cells 28 and provide those data bits or data signals to the corresponding data (DQ) lines in the data bus 26. An exemplary output driver configuration 36 is discussed below with reference to FIG. 3.

A memory controller (not shown) may determine the modes of operation of memory chip 22. Some examples of the input signals or control signals (not shown in FIG. 2) on the control bus 27 include an External Clock signal (CLK), a Chip Select signal, a Row Address Strobe signal, a Column Address Strobe signal, a Write Enable signal, an ODT enable/disable signal (ODT), etc. The memory chip 22 communicates to other devices connected thereto via the pins 24 on the chip 22. These pins, as mentioned before, may be connected to appropriate address, data and control lines to carry out data transfer (i.e., data transmission and reception) operations.

The memory chip 22 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 22 is a DDR DRAM operating at a clock frequency of 667 MHz and an I/O data rate of 1334 MHz.

Figure 1:
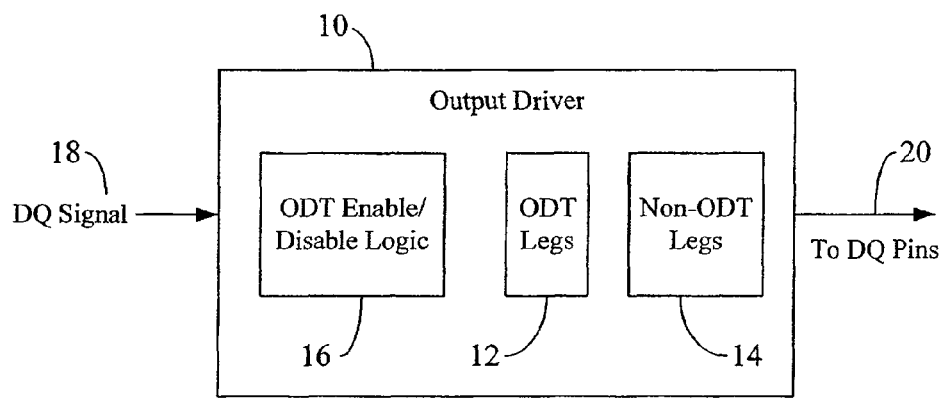
FIG. 1 is a simplified diagram illustrating a portion of an output driver in an electronic device (e.g., a memory chip)

The I/O circuit 34, as noted before, may control the data communication to/from the memory chip 22 via output drivers 36 and other ancillary circuits (not shown). A simplified block diagram of one such output driver 36 is shown in FIG. 2. Similar to the output driver 10 in FIG. 1, the output driver 36 in FIG. 2 may also include a set of ODT legs or ODT portion 38 and a set of non-ODT legs or non-ODT portion 39. The ODT control logic 40 may be a modified version of the ODT control logic 16 to include the ODT mode detector 42 according to one embodiment of the present disclosure. As discussed later, the ODT mode detector 42 may automatically determine internal ODT mode of operation based on a determination of sufficiency of clocks for the ODT portion (e.g., the ODT legs 38) of the output driver 36, and, based on that determination, may automatically switch the internal ODT operational mode from synchronous to asynchronous and vice versa.

Figure 3:
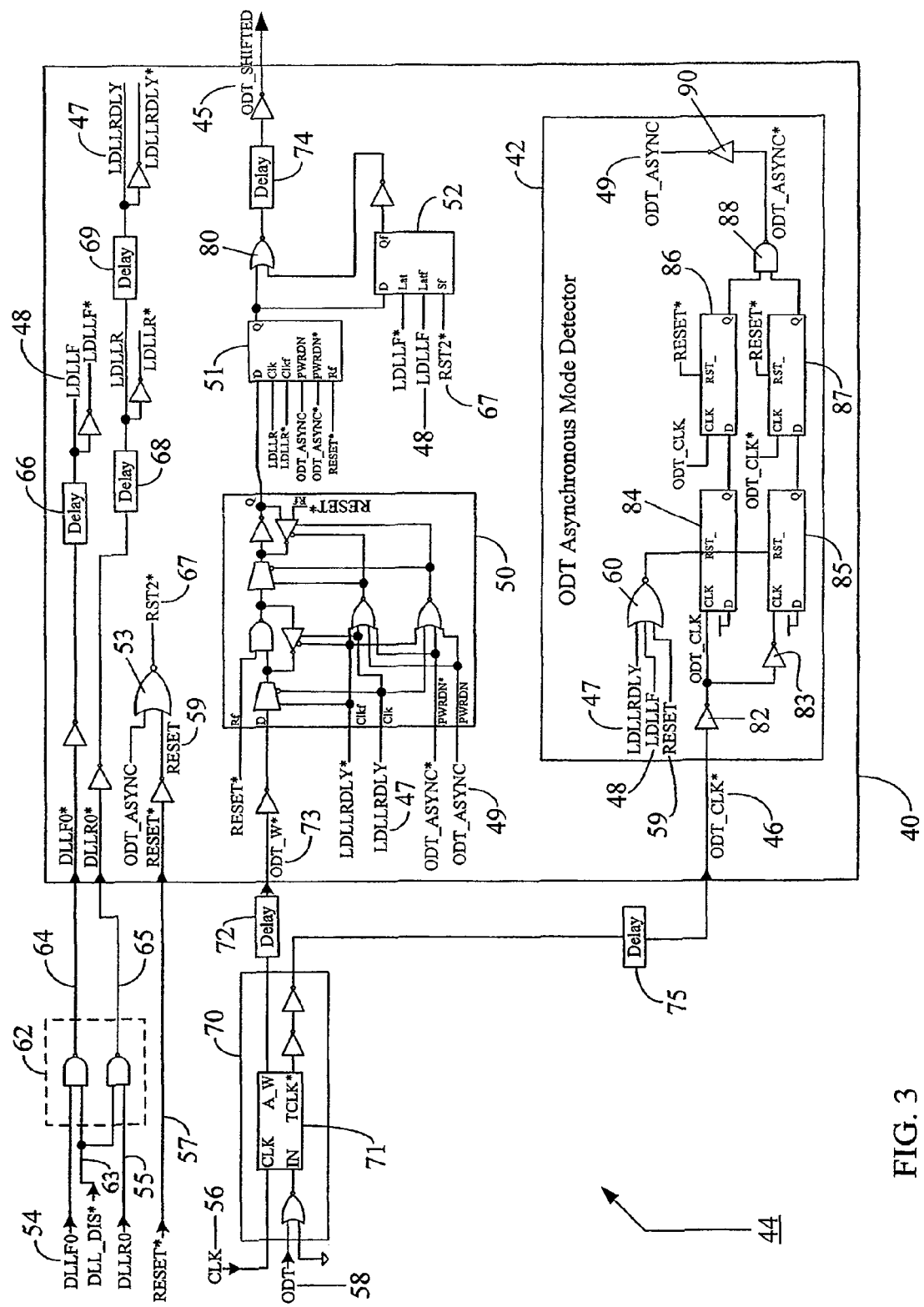
FIG. 3 is an exemplary circuit layout for a portion of the output driver shown in FIG. 2.

FIG. 3 is an exemplary circuit layout 44 for a portion of the output driver 36 shown in FIG. 2. The ODT control logic 40 is shown to include an ODT asynchronous mode detector or the ODT mode detector 42 along with peripheral logic to generate an ODT_Shifted signal 45 that may be supplied to the ODT legs 38 to activate or deactivate the ODT operation depending on whether the ODT_Shifted signal 45 is asserted or not, respectively. The ODT mode detector 42 operates on a number of clock inputs—i.e., an ODT_CLK* signal 46, an LDLLRDLY signal 47, and an LDLLF signal 48 (all of which are discussed later hereinbelow)—to generate an ODT_Async signal 49 as its output. An asserted or "high" ODT_Async signal 49 indicates the asynchronous mode of operation for the ODT portion (e.g., the ODT legs 38) in the output driver 36, whereas a de-asserted or "low" ODT_Async signal 49 indicates the synchronous mode of operation for the ODT portion. As shown in FIG. 3, the ODT_Async output 49 is used in the peripheral logic in the ODT control unit 40 (as an input to complex latches 50-51 and also as an input to the NOR gate 53 which generates the RST2* signal 67 that is an input to the latch 52) to generate the ODT_Shifted signal 45.

It is noted here that the circuit layout 44 shows only a relevant portion of the output driver 36 to illustrate operation of the ODT asynchronous mode detector 42 according to one embodiment of the present disclosure. It is evident to one skilled in the art that the output driver 36 (and, hence, the I/O unit 34) in a commercial memory chip (e.g., the memory chip 22) may include many additional circuits (analog and digital) to implement signal I/O functionality. Such additional circuits or other complex I/O units are not shown in FIG. 3 or discussed herein for the sake of brevity and ease of illustration.

The circuit layout 44 is shown to receive three clock inputs—the DLLF0 signal 54, the DLLR0 signal 55, and the external reference clock signal CLK 56. Two additional input signals are the system reset signal RESET* 57 (which is the complement of the system reset signal RESET 59 shown as an input to the NOR gate 60 in the ODT mode detector 42) and the ODT enable/disable signal (simply, the "ODT signal") 58 received on an external ODT pin (not shown) on the memory chip 22. In case of a DDR DRAM memory chip (e.g., the memory chip 22), the DLLF0 signal 54 may be a falling-edge triggered clock signal that is derived from the falling edges of the incoming system reference clock CLK 56. On the other hand, the DLLR0 signal 55 may be a rising-edge triggered clock signal that is derived from the rising edges of the incoming reference clock CLK 56. Both of these clocks DLLF0 54 and DLLR0 55 may be obtained from a clock synchronization circuit (e.g., a delay locked loop or DLL) (not shown) that may also be a part of the memory chip 22 to provide timing synchronization between the external system clock 56 and memory's internal clock(s) derived from the system clock 56 as is known in the art. The clock synchronization unit may output these rising- and falling-edge triggered clocks to provide internal clock signals to various clock-dependent parts in the memory 22. In the embodiment of FIG. 3, the DLL output clocks 54-55 are supplied to the ODT enable/disable logic unit 40 via a pair of NAND gates 62 for simulation of various signals in the circuit layout 44. As shown in FIG. 3, the DLL clocks 54-55 may be disabled during simulation by asserting the DLL clock disable signal DLL_DIS* 63 (an active low signal) that is an input to both of the NAND gates in the pair 62. In an alternative embodiment, the DLL clocks 54-55 may be applied directly to the ODT control unit 40 without using the pair of NAND gates 62 or the DLL_DIS signal 63.

The DLL clocks output from the pair of NAND gates 62 are labeled as DLLF0* 64 and DLLR0* 65 clock signals which are input to the ODT control logic 40. The DLLF0* clock 64 is passed through an inverter and then a unit delay element 66 to obtain a delayed version of that clock identified as the LDLLF clock signal 48 in FIG. 3. A complement of the LDLLF signal 48 (denoted as "LDLLF*" in FIG. 3) may also be generated (e.g., to supply as an input to the latch 52). Similarly, the DLLR0* clock 65 is passed first through an inverter and then through a unit delay element 68 and another delay element 69 to obtain a delayed version of DLLR0* signal 65 identified as the LDLLRDLY clock signal 47 in FIG. 3. In the embodiment of FIG. 3, the delay element 69 may include four unit delay elements (not shown) to provide appropriate delay to the signal output from the delay unit 68. Various other signals (e.g., the complementary clock signals LDLLR* and LDLLRDLY*) generated from the DLLR0* input 65 are also shown in FIG. 3, but not provided with reference numerals for simplicity of discussion.

Figure 4:
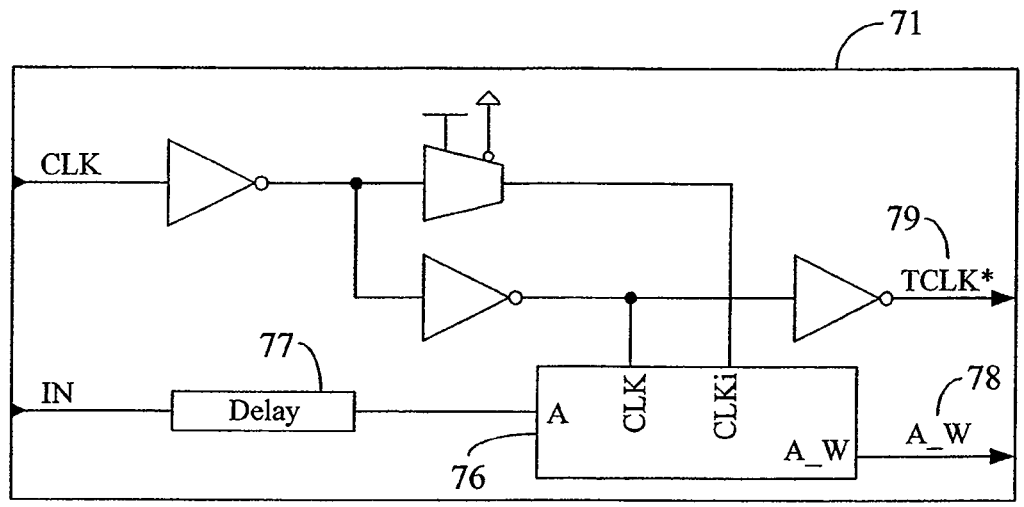
FIG. 4 illustrates an exemplary internal circuit diagram of a setup-and-hold latch that initially receives the CLK and ODT inputs in the circuit layout of FIG. 3.

The system reset signal RESET* 57 is input to the NOR gate 53 in the ODT control unit 40 along with the ODT_Async output 49 from the ODT mode detector 42 to generate a local (internal) reset signal RST2* 67, which is supplied as an input to the latch 52 as noted before. The two other input signals in the circuit layout 44—the external system clock signal CLK 56 and the external ODT enable/disable signal 58—are supplied to the ODT control unit 40 via a setup-and-hold latch 70 and a pair of delay units 72, 75. In the latch 70, the CLK 56 and ODT 58 signals may be supplied as inputs to another latch 71 (which is a part of the latch 70) whose two outputs (internally designated as A_W output and TCLK* clock output) are supplied to respective delay units 72, 75 as shown in FIG. 3. The A_W latch output of the latch 71 may generate an inverted and latched version of the ODT signal 58, whereas the TCLK* output of the latch 71 may generate an inverted version of the external clock signal CLK 56 as can be seen from FIG. 4. FIG. 4 illustrates an exemplary internal circuit layout of the setup-and-hold latch 71, which is shown as a constituent part of the other setup-and-hold latch 70 in FIG. 3. In FIGS. 3 and 4, various input and output signal terminals of the latch 71 (i.e., the "CLK", "IN", "TCLK", and "A_W" terminals) are labeled consistent with the signals the terminals carry. In the multiplexer-based circuit configuration for the latch 71, there may be an additional signal latching circuit 71 and a delay unit 77 (which, in case of the embodiment of FIG. 4, contains two unit delay elements (not shown)) placed between the IN and A_W terminals in the latch 71. The A_W output 78 appearing at the A_W terminal of the latch 71 may be supplied to the delay unit 72 (which, in the embodiment of FIG. 3, may include two unit delay elements) whose output, in turn, is supplied as an ODT_W* input 73 to the ODT control unit 40 as shown. The A_W signal 78 (and, hence, the ODT_W* signal 73) may be an inverted and latched version of the ODT signal 58. In the embodiment of FIG. 3, the frequency of the ODT_W* signal 73 may be identical to the frequency of the ODT signal 58; however, the duty cycle of the ODT_W* signal 73 may be different from the duty cycle of the ODT signal 58. The ODT_W* signal 73 may have "wider" pulses than the ODT signal 58 as can be seen from an exemplary set of simulation waveforms in FIG. 7. The second output of the latch 71—i.e., the TCLK* clock signal 79 in FIG. 4—may be provided as an input clock (i.e., the ODT_CLK* input 46 in FIG. 3) to the ODT mode detector 42 via another delay unit 75 (which, in the embodiment of FIG. 3, may include two unit delay elements) as shown in FIG. 3.

In the embodiment of FIG. 3, the ODT_W* signal 73 is shown supplied as a data (D) input along with other clock (Clk/Clkf), power (Pwrdn/Pwrdn*), and reset (Rf) inputs to the complex latch 50 whose constructional details (i.e., internal circuit layout) and input/output pin designations are also shown in FIG. 3. The other inputs signals to the latch 50 are either generated internally in the ODT control unit 40 (e.g., the ODT_Async 49 and LDLLRDLY 47 inputs, etc.) or supplied through external system inputs to the circuit layout 44 (e.g., the RESET* signal 57). The generation (in case of an internally-generated signal) or reception (in case of an externally-supplied signal) of the signals input to the latch 50 is explained hereinbefore and shown in FIG. 3. Therefore, additional discussion of signals input to the latch 50 is not repeated herein for the sake of brevity. An output (Q) of the latch 50 is shown supplied as a data (D) input to another complex latch 51 in series with the latch 50. In the embodiment of FIG. 3, the construction (i.e., the internal circuit layout) of the latch 51 is identical to that of the latch 50 and, hence, internal circuit layout for the latch 51 is not provided in FIG. 3 for ease of illustration. The output "Q" of latch 51 is supplied as a data input (D) to the data latch 52 and also as one of the inputs to a NOR gate 80. As in the case of the latch 50, the generation or reception of various signals input to the latch 51 is shown in FIG. 3 and already explained hereinbefore. Therefore, additional discussion of inputs to the latch 51 is not repeated herein for the sake of brevity.

Figure 5:
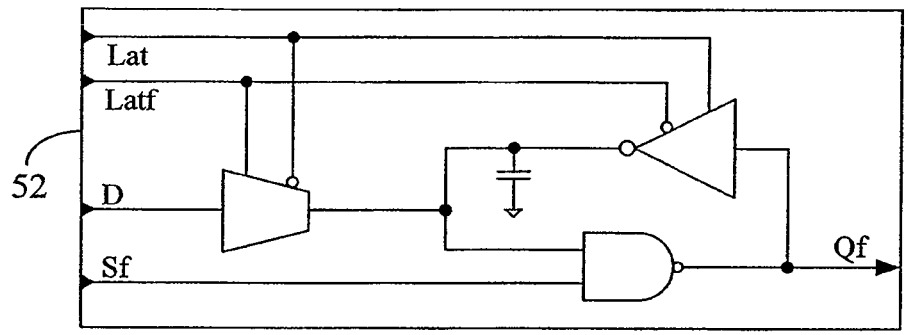
FIG. 5 depicts an exemplary internal circuit layout for the data latch in FIG. 3 that receives the LDLLF and RST2* signals as inputs.

The data latch 52 generates an output signal from the input at its "D" input and various control inputs (e.g., the LDLLF signal and the RST2* signal 67) at its other input terminals (e.g., the complementary "Lat" and "Latf" latching terminals, and the "Sf" control signal input terminal). The complement (Q0 of the output (Q) generated in the latch 52 may be supplied as another input to the NOR gate 80 through an inverter as shown in FIG. 3. FIG. 5 depicts an exemplary internal circuit layout for the data latch 52 in FIG. 3. Various input and output terminal designations for the data latch 52 are identical in FIGS. 3 and 5. Because of the self-explanatory nature of the circuit layout in FIG. 5 to one skilled in the art, additional discussion of the circuit shown in FIG. 5 is not provided herein for the sake of brevity.

Figure 7:
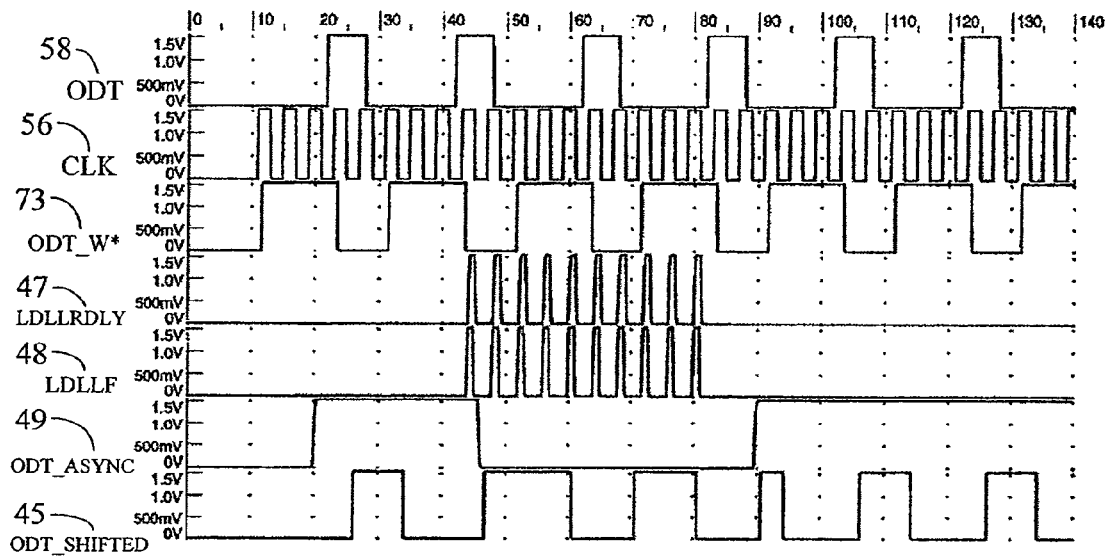
FIG. 7 depicts an exemplary set of simulated waveforms for the circuit configuration of FIG. 3 illustrating the switching between the synchronous and asynchronous ODT modes of operation using the ODT_Async signal generated by the ODT mode detector circuit according to one embodiment of the present disclosure.

In the embodiment of FIG. 3, the output of the NOR gate 80 is supplied to a delay unit 74 (which, in the embodiment of FIG. 3, may include a unit delay element (not shown) and a pair of series connected inverters (not shown)) whose output is passed through an inverter to obtain the ODT_Shifted signal 45 as shown in FIG. 3. As noted hereinbefore, the ODT_Shifted signal 45 may be supplied to the ODT portion (e.g., the ODT legs 38) in the output driver 36 in FIG. 2 to activate or deactivate the ODT operation. It is seen from the circuit generating the ODT_Shifted signal 45 that the generation or assertion of the ODT_Shifted signal 45 may be controlled by the ODT_Async signal 49 that is generated/asserted by the ODT mode detector 42 when the ODT portion of the output driver 36 is to be operated internally in an asynchronous mode. In the embodiment of FIG. 3, when the ODT_Async signal 49 is asserted, the complex latches 50-51 will not latch, but will act as a "flow-through" device for the signal input to the "D" terminal of the first latch 50 (which is an inverted version of the ODT_W* signal 73). Thus, when the ODT_Async signal 49 is asserted, the inverted version of the ODT_W* signal 73 will pass through the latches 50-52 and, hence, the ODT_Shifted signal 45 will be a delayed (due to delays in the signal transmission path involving the latches 50-52 and delay unit 74) and inverted version of the ODT_W* signal 73 as can be seen from the exemplary set of waveforms in FIG. 7 discussed later hereinbelow. However, when the ODT_Async signal 49 is not asserted (i.e., when the ODT mode detector 42 determines that the ODT legs 38 are to be operated in an internally synchronous mode), the power down (PWRDN) terminals of the latches 50-51 have a logic "low" or "0" value, and, hence, the latches 50-51 perform signal latching operation. In this situation, the operation of latches 50-52 results in generation of the ODT_Shifted signal 45 which is an inverted, delayed and latched version of the ODT_W* input signal 73. FIG. 7 illustrates the different pulse width (i.e., "wider" or "latched" version) of the pulses in the ODT_Shifted signal 45 as compared to the pulse width of the ODT_W* signal 73 during de-assertion of ODT_Async signal 49 according to one embodiment of the present disclosure. Additional details about the timing relation between the ODT_W* signal 73 and the ODT_Shifted signal 45 are discussed later hereinbelow with reference to the discussion of FIG. 7. Thus, it is seen that the ODT mode detector 42 may control (through the ODT_Async signal 49 controlling the assertion of the ODT_Shifted signal 45) whether the ODT legs 38 are to be operated in an internally synchronous or asynchronous mode. The generation of the ODT_Async signal 49 is discussed in detail hereinbelow.

Figure 6:
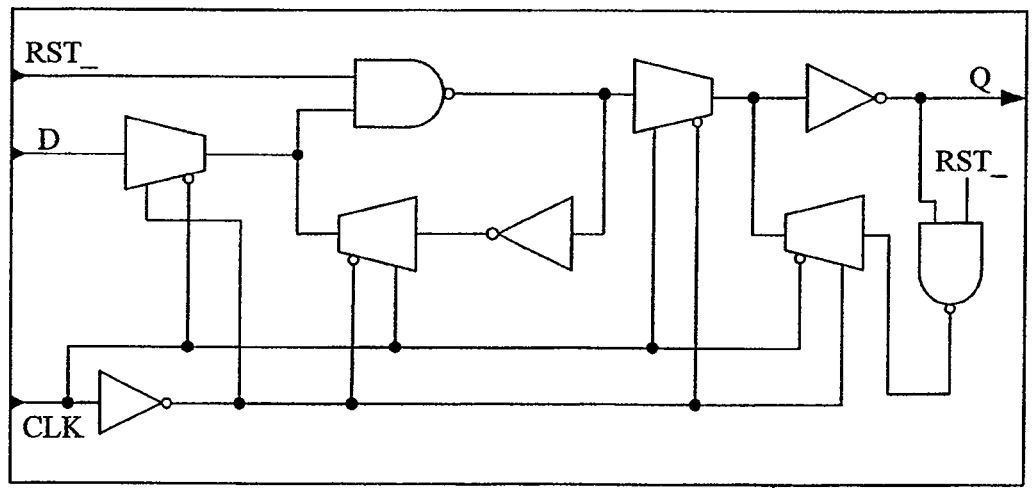
FIG. 6 illustrates an exemplary circuit layout depicting the internal construction of one of the flipflops in the ODT asynchronous mode detector circuit of FIG. 3.

Referring now to the circuit layout of the ODT mode detector 42 in FIG. 3, it is seen that the external clock signal CLK 56 is supplied to the ODT mode detector 42 in the form of the ODT_CLK* signal 46 as discussed hereinbefore. The ODT_CLK* signal 46 passes through two inverters 82, 83 and clocks the flipflops or latches 85, 87; whereas the inverted version of the ODT_CLK* signal 46 (designated as the "ODT_CLK" output of the inverter 82) clocks the other two flipflops 84, 86 in the ODT mode detector 42 as shown in FIG. 3. The data or "D" input terminals of all flipflops 84, 85 may be connected to a circuit "high" potential (e.g., a Vcc or similar other high voltage level). The output "Q" of the flipflop 84 is supplied as a data input to the flipflop 86, whereas the output of the flipflop 85 is supplied as a data input to the flipflop 87 as shown. The reset terminals (designated as "RST_" terminals) of flipflops 86, 87 are connected to the system reset signal RESET* 57, whereas the reset terminals of flipflops 84, 85 are connected to the output of the NOR gate 60. The outputs (terminals marked as "Q") of flipflops 86, 87 are applied as inputs to a NAND gate 88 whose output is inverted by the inverter 90 to generate the ODT_Async signal 49. As noted hereinbefore, the three-input NOR gate 60 may receive two clock signals LDLLRDLY 47 and LDLLF 48, and the system reset signal RESET 59 as inputs and generate an output that is applied to the reset terminals of flipflops 84, 85. FIG. 6 illustrates an exemplary circuit layout depicting the internal construction of flipflop 84 in the ODT mode detector 42 with all signal terminals of the flipflop 84 marked identically in FIGS. 3 and 6. All other flipflops 85-87 may have similar internal construction and, hence, only the circuit layout of flipflop 84 is shown in FIG. 6. Because of the simplicity of the construction of flipflop 84 and because of the familiarity of its operation to one skilled in the art, additional discussion of the circuit in FIG. 6 is not provided herein for the sake of brevity.

It is observed here that even though the ODT pin (not shown) on the memory chip 22 (FIG. 2) is externally synchronous (i.e., the ODT signal 58 on the ODT pin always has a fixed relationship with respect to the memory device's 22 external clock), the internal or "actual" operational mode for the ODT portion (e.g., the ODT legs 38 in FIG. 2) in the output driver 36 may be synchronous or asynchronous depending on the determination of clock sufficiency, i.e. whether all the clock signals needed for that mode of operation are available. Determination of whether all the clock signals needed for a particular mode of operation are present, is performed by the ODT mode detector 42. Furthermore, when the current mode of operation of the memory device 22 is a power down mode, an external memory controller (not shown) may require the memory chip 22 to place the ODT portion in its output driver 36 in an asynchronous mode of operation despite the possibility that there may still be some clock cycles available (before the memory device 22 transitions into the power down mode) internally in the memory device 22 to continue a synchronous ODT mode of operation. Thus, it may be preferable to assess or detect whether the ODT circuitry (e.g., the ODT legs 38 and the ODT enable/disable logic unit 40) in the memory chip 22 has the required clocking for synchronous mode of operation and to automatically switch the internal ODT operational mode to synchronous, which is still within the external asynchronous specification. Thus, it may be desirable to avoid wasting internal clocks or blindly setting the internal ODT operational mode based on the memory's current state of operation (e.g., a power down state) without considering the clock sufficiency status for the ODT portion (e.g., the ODT legs 38) in the output driver 36. A clock sufficiency-based determination of internal ODT mode of operation may not only facilitate automatic switching of ODT mode of operation (from asynchronous to synchronous and vice versa), but may also allow actual (internal) clocking to the ODT circuitry (including, for example, the ODT enable/disable logic 40 and ODT legs 38) to be changed during various modes of operation (synchronous vs. asynchronous) or halted at any time without worrying about clock boundary conditions.

The ODT mode detector circuit 42 illustrated in FIG. 3 according to one embodiment of the present disclosure may be used to determine the clock sufficiency status for the ODT portion (e.g., the ODT legs 38) in the output driver 36. If the ODT mode detector 42 determines that there are sufficiency ODT clock pulses for the ODT portion, then the ODT_Async signal 49 remains de-asserted and the ODT portion may be internally operated in the synchronous mode. If clock pulses are found to be insufficient for the synchronous mode of operation, the ODT_Async signal 49 may be asserted to establish the asynchronous mode of operation for the ODT portion. The clock sufficiency determination may be made based on the timing relationship between the clock pulses LDLLRDLY 47 and LDLLF 48 with respect to the ODT_CLK*46, which are all inputs to the ODT mode detector 42 as shown in FIG. 3. The synchronous ODT mode of operation may be treated as a subset of the asynchronous ODT mode of operation because of the relatively stringent timing requirements for transitioning from the asynchronous to synchronous mode, but a wider timing range for transitioning from the synchronous to the asynchronous mode.

For example, in one embodiment, when going from synchronous to asynchronous mode, one complete cycle (having period equal to the clock period of the CLK signal 56) of no clocking (i.e., absence of a pulse in the LDLLRDLY 47 clock signal 47 and the LDLLF clock signal 48 for the duration of one complete clock cycle) may be required before the ODT mode detector 42 asserts the ODT_Async signal 49. The circuit design of the ODT mode detector 42 in the embodiment of FIG. 3 allows the ODT mode detector 42 to detect such absence of clocks. That is, when the ODT mode detector 42 does not receive any of the DLL clock inputs 47, 48 (and assuming that the RESET signal 59 is not asserted), the output of the NOR gate 60 goes "high", thereby operating the flipflops 84, 85 to clock the "high" voltage input at their respective "D" terminals to the next pair of flipflops 86, 87, which also clock these "high" voltage signals to the inputs of the NAND gate 88. Therefore, when there is no DLL clock (whether rising edge-triggered or falling edge-triggered) in the span of one clock cycle, that condition may be interpreted as an "insufficient" clocking to sustain an internal synchronous ODT mode of operation. In that event, both the inputs to the NAND gate 88 go "high", thereby resulting in the assertion of the ODT_Async signal 49 to switch the ODT mode of operation to the asynchronous mode. It is observed here that because the DLL clocks LDLLRDLY 47 and LDLLF 48 are derived from the external system clock 56, as mentioned hereinbefore, the clock period of these DLL clocks may be identical to the clock period of the system reference clock 56, but the duty cycle of the DLL clocks may differ from the duty cycle of the system clock 56 as can be seen from the exemplary waveforms for these three clocks in FIG. 7 discussed later hereinbelow.

In one embodiment, the clock synchronization circuit (e.g., a DLL (not shown)) that generates the DLLR0 input clock 55 (which becomes the LDLLRDLY clock 47 after some amount of delay as discussed hereinbefore) and the DLLF0 input clock 54 (which becomes the LDLLF clock 48 after some amount of delay as discussed before) may generate these two clock signals in pairs when clocking is in its normal state (e.g., during the memory's 22 active mode of operation). However, once the clocking is shut down (e.g., during the memory's power down mode of operation), a pulse in the DLLR0 clock 55 may fire with no DLLF0 pulse

54 to follow (which normally occurs at most a half clock cycle later) or the clocking may end on a DLLF0 pulse without a following DLLR0 pulse. Therefore, in the embodiment of FIG. 3, the DLLF0 and DLLR0 clocks 54, 55, respectively, are used (through their respective delayed versions LDLLF 48 and LDLLRDLY 47) in the clock sufficiency determination by the ODT mode detector 42. The circuit for the ODT detector 42 may be designed by giving the synchronous mode of ODT operation a priority over the asynchronous ODT mode of operation because of the tighter timing requirements when transitioning from the asynchronous to the synchronous mode. Because the synchronous mode timing requirements are a subset of the asynchronous mode timing specifications, a circuit designed to meet the synchronous timing specification will always be within the much looser asynchronous timing specification. In one embodiment, the transitioning from the asynchronous mode (related to absence of a pulse in each of the DLL clocks 47, 48 for the duration equal to one complete clock cycle) to the synchronous mode may require the presence or occurrence of only a half cycle of a clock pulse (i.e., a pulse occurring during a half clock period in the LDLLRDLY clock 47 or the LDLLF clock 48) to turn off (de-assert) the ODT_Async signal 49 by bringing it "low" and thereby starting the synchronous ODT mode of operation. In the ODT mode detector 42, as soon as one of the clock inputs 47, 48 has a pulse or "high" voltage level occurring in it, the output of the NOR gate 60 goes to the "low" state, thereby resetting the flipflops 84, 85, which results in the clocking of at least one "low" voltage input to the NAND gate 88 and, hence, de-asserting or turning off the ODT_Async signal 49 at the output of the inverter 90.

It is observed here that the ODT portion in the output driver 36 may not go into an internal asynchronous mode and then turn around and go back into an internal synchronous mode and then switch again to the asynchronous mode in a short amount of time because of the timing constraints placed in the operational timing specification for the ODT portion. Therefore, when the ODT portion (e.g., the ODT legs 38) is in the asynchronous mode and transitions to the synchronous mode, the operational timing specification may require the ODT control unit 40 to guarantee that the ODT portion is operated in the synchronous mode for many clock cycles without random and abrupt switching to the asynchronous mode. This timing requirement may be exploited when making the determination (using the ODT mode detector 42) for switching from the asynchronous to the synchronous mode because as soon as LDLLRDLY pulse 47 (or the LDLLF pulse 48) fires (from a clock synchronization circuit), it can be assumed that the other corresponding pulse LDLLF 48 (or LDLLRDLY 47) will fire at most a half of a clock cycle later because the pulse firing indicates the starting of the synchronous mode that cannot be terminated for several more clock cycles to go back to the previous asynchronous mode. Therefore, the ODT detector 42 may be configured to determine that there is sufficient clocking for the ODT portion in the output driver 36 to transition into the synchronous mode when there is at least one half of a clock cycle of clocking present in any one of the input DLL clocks 47, 48.

FIG. 7 depicts an exemplary set of simulated waveforms for the circuit configuration 44 of FIG. 3 illustrating the switching between the synchronous and asynchronous ODT modes of operation using the ODT_Async signal 49 generated by the ODT mode detector circuit 42 according to one embodiment of the present disclosure. The simulated external ODT signal 58 and system reference clock signal 56 are shown at the top in FIG. 7. The inverted and latched version of the ODT signal 58—i.e., the ODT_W* signal 73—is shown next followed by a simulated set of delayed DLL clock pulses in the LDLLRDLY clock 47 and LDLLF clock 48. In the embodiment of FIG. 7, both of the DLL clocks 47, 48 appear closely aligned with each other. However, as discussed hereinbefore, in other embodiments, there may be a half a clock cycle of time delay between corresponding pulses in the LDLLRDLY 47 and LDLLF 48 clock signals. It is seen from FIG. 7 that the ODT_Async signal 49 may be asserted (by the ODT mode detector 42) in the absence of any DLL clock pulse in the input clocks 47-48 to signify the asynchronous ODT mode of operation. The ODT_Async signal 49 may be de-asserted or brought to a "low" level (to switch the internal ODT mode of operation to the synchronous mode) when at least one clock pulse occurs in at least one of the DLL clock inputs 47, 48 during a half clock cycle period and is detected by the ODT mode detector 42 as explained hereinbefore. The corresponding ODT_Shifted signal 45 generated at the output of the ODT control unit 40 in FIG. 3 is also shown as the last waveform in FIG. 7.

It is observed with reference to the simulated waveforms in FIG. 7 that a timing specification (known to one skilled in the art, but not discussed in detail herein for the sake of brevity) for the ODT modes of operation may require that in the internal asynchronous mode of ODT operation, there may be a minimum of 2 ns (for example) and a maximum of 2 clock periods (plus some allowable skew) of delay in assertion of an ODT_Shifted pulse 45 after a corresponding pulse in the external ODT signal 58 (represented in FIG. 7 by the ODT_W* signal 73) is asserted. As mentioned before, the term "clock period" may refer herein to the clock period of the external system clock 56 (or the period of any of the DLL clocks 47, 48). On the other hand, again in case of the internal asynchronous ODT mode of operation, the timing specification may require that there may be a minimum of 2 ns (for example) and a maximum of 2½ clock periods (plus some allowable skew) of delay in de-assertion of the ODT_Shifted pulse 45 after the corresponding pulse in the ODT_W* signal 73 is de-asserted. During synchronous operation, the timing specification may require exactly two clock periods (plus or minus allowable skew) to assert the ODT_shifted signal 45 and it may also require two and a half clock periods (plus or minus allowable skew) to de-assert the ODT_Shifted signal 45; Therefore, the synchronous mode of operation is a subset of the looser asynchronous mode of operation and can be internally used to assure operation within the specification whenever clock sufficiency warrants such operation, Thus, it is observed that the internal ODT mode of operation (asynchronous vs. synchronous) may be determined by the timing relationship between the external ODT signal 58 (or its representative signal ODT_W* 73) and the ODT_Shifted signal 45 that is sent to the ODT portion in the memory output driver 36. As discussed hereinbefore, the generation/assertion of the ODT_ Shifted signal 45 may be controlled by the ODT_Async signal 49 from the ODT mode detector 42 whose assertion or de-assertion reflects, respectively, whether the internal ODT mode of operation is asynchronous or synchronous. In the embodiment of FIG. 3, the ODT_Async signal-based generation of the ODT_Shifted signal 45 also complies with various ODT operational timing specification requirements discussed hereinbefore.

Thus, the ODT mode detector 42 may not only satisfy the timing requirements that may be necessary under a given ODT operational timing specification, but may also allow the actual clocking to the ODT circuitry (including, for example, the ODT control logic 40 and the ODT legs 38) to be changed during various internal ODT modes of operation (synchronous or asynchronous) because of the ODT mode detector's 42 ability to detect clock sufficiency to determine ODT mode of operation as opposed to blind reliance on clock presence indicator signal or signals (which may or may not indicate whether sufficient clock pulses are available for ODT portion to be operating in the synchronous mode). In one embodiment, because of the ability of the ODT mode detector 42 to detect clock sufficiency for internal ODT modes of operation, the actual clocking to the ODT circuitry in the output driver 36 may be made programmable after tapeout in the memory chip 22 without reworking the ODT control logic (e.g., the logic unit 40 in FIG. 3) for each memory state of operation (e.g., an active state, a power down state, etc.). Thus, a part's clocking logic may be changed without modifying the circuit configuration of the ODT mode detector 42 or the ODT control logic 40, thereby resulting in significant efficiency in designing and implementing various circuit configurations. This is different from the clocking logic-dependent ODT control logic 16 in the prior art output driver configuration 10 discussed with reference to FIG. 1 earlier hereinbefore. Furthermore, the clock sufficiency-based operation of the ODT mode detector 42 allows the clocking to the ODT circuitry in the output driver 36 to be halted at any time (e.g., during testing) without worrying about clock boundary conditions. In the prior art output driver 10 of FIG. 1, such halted clocking and associated clock boundary conditions may result in mistakenly switching the ODT mode of operation (e.g., from asynchronous to synchronous) regardless of whether there is sufficient clocking available to sustain the new mode (e.g., the synchronous mode).

It is observed here that the ODT mode detector 42 according to one embodiment of the present disclosure has a quite simplified construction, thereby resulting in a significantly less complex logic circuit design for the ODT enable/disable logic unit 40 in the memory chip 22. This simplicity in the construction of the ODT mode detector 42 results in a minimal consumption of the valuable chip real estate, while freeing up other chip real estate for a designer to include other circuits. The adaptability of the ODT mode detector 42, without modifications, to different clocking logic implementations for the memory chip 22 further allows efficient use of chip real estate. Furthermore, the simplified construction and operation of the ODT mode detector 42 according to one embodiment of the present disclosure results in no negative effect on the speed with which signals may be output from the output driver 36 in the memory chip 22.

Figure 8:
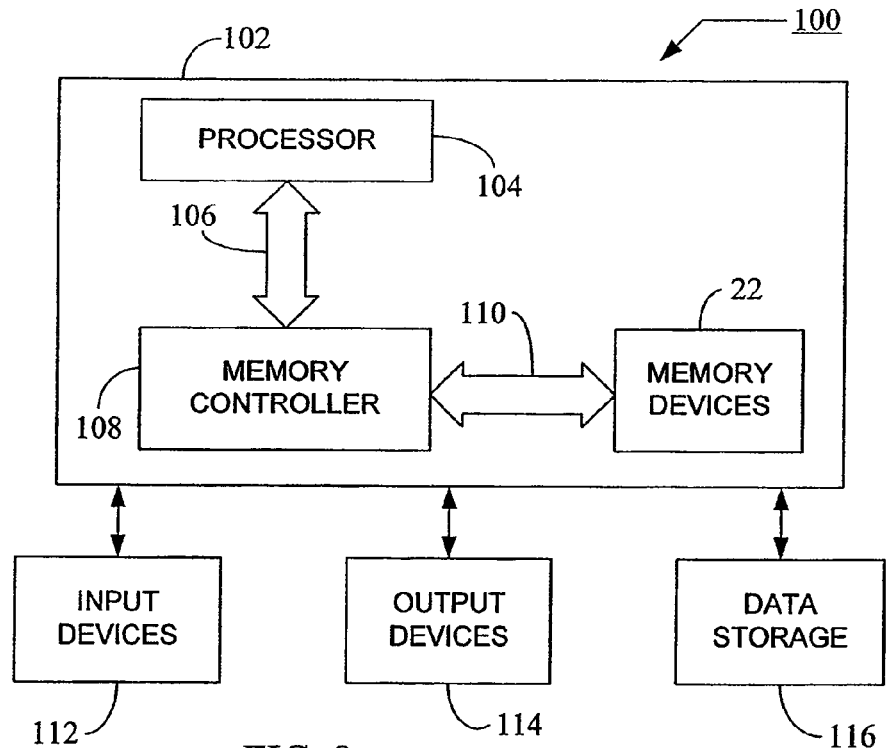
FIG. 8 is a block diagram depicting a system in which one or more memory chips illustrated in FIG. 2 may be used.

FIG. 8 is a block diagram depicting a system 100 in which one or more memory chips 22 illustrated in FIG. 2 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown). The memory controller 108 is also in communication with a set of memory devices 22 (i.e., multiple memory chips 22 of the type shown in FIG. 2) through another bus 110 (which may be similar to the bus 24 shown in FIG. 2). In one embodiment, each memory device 22 is a DDR3 DRAM operating at a clock frequency of 667 MHz and a data I/O rate of 1334 MHz. Each memory device 22 may include appropriate data storage and retrieval circuitry (not shown in FIG. 8) as shown in FIG. 2. The processor 104 can perform a plurality of functions based on information and data stored in the memories 22.

The memory controller 108 can be a microprocessor, digital signal processor, embedded processor, micro-controller, dedicated memory test chip, a tester platform, or the like. The memory controller 108 may control routine data transfer operations to/from the memories 22, for example, when the memory devices 22 are part of an operational computing system 102. The memory controller 108 may reside on the same motherboard (not shown) as that carrying the memory chips 22. Various other configurations of electrical connection between the memory chips 22 and the memory controller 108 may be possible. For example, the memory controller 108 may be a remote entity communicating with the memory chips 22 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes. As noted before, the memory devices 22 in the computing unit 102 have the configuration illustrated in FIG. 2, i.e., each memory device 22 includes an I/O circuit 34 with an ODT mode detector (e.g., the detector 42 in FIGS. 2-3) according to one embodiment of the present disclosure.

Although the discussion given hereinbefore has been primarily with reference to memory devices, it is evident that the signal output driver configuration and circuit details illustrated in FIGS. 2-6 are exemplary only, and may be employed, with suitable modifications which may be evident to one skilled in the art, in any non-memory electronic device that may utilize a signal driver circuit having ODT and non-ODT legs as illustrated, for example, in FIG. 2. The circuit configuration of the ODT mode detector 42 according to one embodiment of the present disclosure may be implemented in a signal output driver of any non-memory electronic device (with suitable modifications evident to one skilled in the art) where internal ODT mode of operation is switched from an asynchronous mode to a synchronous mode and vice versa. Such implementations are not discussed in detail herein for the sake of brevity, however the present disclosure fully contemplates such implementations in other non-memory electronic devices.

The foregoing describes a system and method to operate an electronic device, such as a memory chip, with an output driver circuit that is configured to include an ODT (On-Die Termination) asynchronous/synchronous mode detector that detects whether there is sufficient internal clocking available to operate the ODT portion in the output driver in the synchronous mode of operation or to switch the operation to the asynchronous mode. The clock-sufficiency based determination of internal ODT mode of operation (synchronous vs. asynchronous) avoids utilization of complex and inflexible clock processing logic in an ODT control unit in the output driver. The switching of ODT mode of operation based on a rigid reliance on the indication of the current state of the electronic device (e.g., active state, power down state, etc.) is avoided to take into account the presence and sufficiency of clock signals required to sustain the new ODT mode of operation. This enables the actual clocking to the ODT circuitry to be changed during various device operational modes (e.g., active, power down, etc.) without re-designing the ODT control logic for each of those modes. The simplicity and flexibility of the ODT mode detector design allows for efficient use of chip real estate without affecting the signal transfer speed of the output driver in the electronic device.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method comprising:
   receiving a control signal to operate a memory device in power down state associated with an asynchronous mode of operation for on-die termination (ODT) circuitry;
   determining a sufficiency of clock signals for a synchronous mode of operation when a clock pulse occurs in a first input clock signal based on a rising edge of an external clock signal or a second input clock signal based on a failing edge of the external clock signal during half of a clock period of the external clock signal;
   determining an insufficiency of clock signals for a synchronous mode of operation when no clock pulses occur for both the first input clock signal and the second input clock signal during one clock period of the external clock signal;
   if the determining indicates sufficiency of clock signals, operating the memory device in the power down state using the synchronous mode of operation; and
   if the determining indicates insufficiency of clock signals, operating the memory device in the power down state using the asynchronous mode of operation.

2. The method of claim 1, wherein the control signal is indicative of the memory device entering a power-down mode.

3. The method of claim 1, wherein the determining is performed by a mode detector.

4. The method of claim 3, wherein the determining is performed automatically by the mode detector.

5. The method of claim 1, wherein the control signal is provided by a memory controller.

6. The method of claim 1, further comprising:
   monitoring the sufficiency of clock signals;
   if the monitoring indicates sufficiency of clock signals, operating the memory device in the synchronous mode of operation; and
   if the monitoring indicates insufficiency of clock signals, operating the memory device in the asynchronous mode of operation.

7. A method for controlling an on-die termination (ODT) circuit in an electronic device, comprising:
   operating the electronic device in a power down state;
   monitoring the sufficient availability of an internal clock signal based on an occurrence of a clock pulse in either a first input clock signal based on a rising edge of an external clock signal or a second input clock signal based on a falling edge of the external clock signal during half of a clock period of the external clock signal;
   monitoring the insufficient availability of an internal clock signal based on an occurrence of a clock pulse in both the first input clock signal and the second input clock signal during one clock period of the external clock signal;
   if the monitoring indicates a sufficiency of the internal clock signal, operating the ODT circuit in a synchronous mode of operation, at least in part, while the electronic device is operating in the power down state; and
   if the monitoring indicates an insufficiency of the internal clock signal, changing the ODT circuit to an asynchronous mode of operation, at least in part, while the electronic device is operating in the power down state.

8. The method of claim 7, further comprising:
   receiving a command from a memory controller to operate the ODT circuit in an asynchronous mode of operation; and
   changing the ODT circuit to the asynchronous mode of operation only if the internal clock signal is not sufficiently available.

9. The method of claim 8, further comprising:
   changing the ODT circuit to the synchronous mode of operation responsive to the sufficient availability of the internal clock signal.

10. The method of claim 9, wherein the changing is based, at least in part, on comparing the internal clock signal with an internal signal.

11. An output driver in an electronic device, the output driver comprising:
    an on-die termination (ODT) circuit having an input, wherein the ODT circuit is configured to operate in a synchronous mode of operation or an asynchronous mode of operation, in accordance with a control signal received at the input; and
    a control unit configured to determine a sufficiency of an internal clock signal for the synchronous mode of operation based on a clock pulse in either a first input clock signal based on a rising edge of an external clock signal or a second input clock signal based on a falling edge of the external clock signal during half of a clock period of the external clock signal and configured to determine an insufficiency of the internal clock signal for the synchronous mode of operation based on a clock pulse in both the first input clock signal and the second input clock signal during one clock period of the external clock signal, wherein the control unit is further configured, if the internal clock signal is sufficient, to generate the control signal indicative of the synchronous mode of operation even if a state of operation of the electronic device changes from an active state, and wherein the control unit is further configured, if the internal clock signal is insufficient, to generate the control signal indicative of the asynchronous mode of operation.

12. The output driver of claim 11, wherein the control unit comprises a mode detector configured to determine the sufficiency of the clock signal.

13. An output driver in an electronic device, the output driver comprising:

an on-die termination (ODT) circuit having an input, wherein the ODT circuit is configured to operate in a synchronous mode of operation or an asynchronous mode of operation, in accordance with a control signal received at the input; and a control unit configured to determine a sufficiency of an internal clock signal for the synchronous mode of operation, wherein the control unit is further configured, if the internal clock signal is sufficient, to generate the control signal indicative of the synchronous mode of operation, and wherein the control unit is further configured, if the internal clock signal is insufficient, to generate the control signal indicative of the asynchronous mode of operation, wherein the control unit includes a mode detector configured to determine the sufficiency of the clock signal, the mode detector comprising:

a NOR gate for receiving a first input clock and a second input clock and for generating a first output therefrom;

a first latch having a first reset terminal for receiving said first output, a first clock terminal for receiving a clock signal, a first data terminal for receiving a fixed voltage signal thereon, and a first output terminal for conveying a second output generated by said first latch;

a second latch connected in series with said first latch and having a second reset terminal for receiving a system reset signal, a second clock terminal for receiving said clock signal, a second data terminal connected to said first output terminal for receiving said second output, and a second output terminal for conveying a third output generated by said second latch;

a third latch having a third reset terminal for receiving said first output, a third clock terminal for receiving said clock signal, a third data terminal for receiving a fixed voltage signal thereon, and a third output terminal for conveying a fourth output generated by said third latch;

a fourth latch connected in series with said third latch and having a fourth reset terminal for receiving said system reset signal, a fourth clock terminal for receiving said clock signal, a fourth data terminal connected to said third output terminal for receiving said fourth output, and a fourth output terminal for conveying a fifth output generated by said fourth latch; and a NAND gate for receiving said third and said fifth outputs as inputs thereto and for generating the control signal at an output thereof.

14. The output driver of claim 11, wherein the electronic device comprises a memory device.

15. A method for controlling an on-die termination (ODT) circuit in an electronic device receiving an external clock signal, comprising:

operating the electronic device in a power down state;

operating the ODT circuit in a synchronous mode of operation, at least in part, while the electronic device is operating in the power down state;

receiving a command from a memory controller to operate the ODT circuit in an asynchronous mode of operation; and changing the ODT circuit to an asynchronous mode of operation, at least in part, while the electronic device is operating in the power down state and wherein said changing is responsive to detecting no clock pulses in both a first input clock signal and a second input clock signal during a clock period of the external clock signal, wherein the first input clock signal is based on a rising edge of the external clock signal and the second input clock signal is based on a falling edge of the external clock signal.

* * * * *